(12) United States Patent
Kamibaba

(10) Patent No.: US 11,056,484 B2
(45) Date of Patent: Jul. 6, 2021

(54) SEMICONDUCTOR DEVICE WITH MULTIPLE TRENCH STRUCTURES

(71) Applicant: Mitsubishi Electric Corporation, Tokyo (JP)

(72) Inventor: Ryu Kamibaba, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/533,958

(22) Filed: Aug. 7, 2019

(65) Prior Publication Data
US 2020/0126973 A1    Apr. 23, 2020

(30) Foreign Application Priority Data
Oct. 18, 2018 (JP) .............................. JP2018-196616

(51) Int. Cl.
*H01L 27/06*    (2006.01)
*H01L 29/739*    (2006.01)
(Continued)

(52) U.S. Cl.
CPC ...... *H01L 27/0635* (2013.01); *H01L 29/1004* (2013.01); *H01L 29/1095* (2013.01);
(Continued)

(58) Field of Classification Search
CPC .............. H01L 29/1095; H01L 29/4236; H01L 29/7397; H01L 29/7813; H01L 29/861
See application file for complete search history.

(56) References Cited

U.S. PATENT DOCUMENTS 8,441,046 B2    5/2013   Bobde et al.
8,614,483 B2 *  12/2013  Tanabe .............. H01L 29/66348
                                                            257/331
(Continued)

FOREIGN PATENT DOCUMENTS

EP        2003694 A2 * 12/2008 ............. H01L 27/06
JP     2014-060362 A     4/2014
(Continued)

OTHER PUBLICATIONS

Machine translation, Naito, Japanese Pat. Pub. No. 2017-147431, translation date: Sep. 20, 2020, Espacenet, all pages. (Year: 2020).*
(Continued)

*Primary Examiner* — Victoria K. Hall
(74) *Attorney, Agent, or Firm* — Studebaker & Brackett PC

(57) ABSTRACT

A semiconductor device includes an IGBT region extending from a front surface to a rear surface of a semiconductor substrate including a first conductive type drift layer, and a diode region lying adjacent to the IGBT region. The IGBT region includes a second conductive type base layer on a side facing the front surface and a first trench portion penetrating the base layer. The first trench portion includes a first gate electrode, a second gate electrode provided directly below the first gate electrode, and an insulating film provided on a side surface of the first gate electrode, between the first gate electrode and the second gate electrode and in a position to contact the second gate electrode. The diode region includes a second conductive type anode layer and a second trench portion including a dummy gate electrode on the side facing the front surface.

9 Claims, 7 Drawing Sheets

(51) Int. Cl.
  *H01L 29/861* (2006.01)
  *H01L 29/10* (2006.01)
  *H01L 29/423* (2006.01)
  *H01L 29/417* (2006.01)

(52) U.S. Cl.
  CPC ........ *H01L 29/417* (2013.01); *H01L 29/4236* (2013.01); *H01L 29/7397* (2013.01); *H01L 29/861* (2013.01)

(56) References Cited

U.S. PATENT DOCUMENTS

| | | | | |
|---|---|---|---|---|
| 9,515,067 B2* | 12/2016 | Saikaku | ................ | H01L 29/407 |
| 10,818,782 B2* | 10/2020 | Naito | ................ | H01L 29/1004 |
| 2004/0113202 A1* | 6/2004 | Kocon | ................ | H01L 29/407 |
| | | | | 257/330 |
| 2005/0167742 A1* | 8/2005 | Challa | ................ | H01L 29/7804 |
| | | | | 257/328 |
| 2006/0001084 A1* | 1/2006 | Kelly | ................ | H01L 29/7397 |
| | | | | 257/329 |
| 2006/0214221 A1* | 9/2006 | Challa | ............... | H01L 29/66734 |
| | | | | 257/328 |
| 2006/0273386 A1* | 12/2006 | Yilmaz | ............... | H01L 29/7827 |
| | | | | 257/330 |
| 2008/0042172 A1* | 2/2008 | Hirler | .................. | H01L 29/407 |
| | | | | 257/288 |
| 2009/0152667 A1* | 6/2009 | Rieger | ................ | H01L 29/0634 |
| | | | | 257/488 |
| 2009/0242931 A1* | 10/2009 | Tsuzuki | ................ | H01L 29/167 |
| | | | | 257/143 |
| 2009/0278166 A1* | 11/2009 | Soeno | ................ | H01L 27/0664 |
| | | | | 257/133 |
| 2010/0059797 A1* | 3/2010 | Ngai | .................. | H01L 29/7813 |
| | | | | 257/255 |
| 2010/0219785 A1* | 9/2010 | Hirose | ............. | H01L 29/66348 |
| | | | | 318/519 |
| 2011/0193132 A1* | 8/2011 | Kouno | ................ | H01L 29/0696 |
| | | | | 257/139 |
| 2011/0215399 A1* | 9/2011 | Matsuura | ................ | H01L 29/78 |
| | | | | 257/331 |
| 2012/0025874 A1* | 2/2012 | Saikaku | .............. | H01L 29/7397 |
| | | | | 327/109 |
| 2012/0153386 A1* | 6/2012 | Hirler | ................. | H01L 29/872 |
| | | | | 257/334 |
| 2013/0075784 A1* | 3/2013 | Ikeda | .................. | H01L 29/7397 |
| | | | | 257/140 |
| 2013/0075809 A1* | 3/2013 | Hsieh | ............... | H01L 29/66348 |
| | | | | 257/328 |
| 2014/0077293 A1 | 3/2014 | Kitagawa | | |
| 2014/0084363 A1* | 3/2014 | Pearse | ............... | H01L 29/66734 |
| | | | | 257/330 |
| 2014/0264433 A1* | 9/2014 | Hu | .................... | H01L 29/42368 |
| | | | | 257/139 |
| 2014/0374842 A1* | 12/2014 | Weber | ................. | H01L 29/0649 |
| | | | | 257/409 |
| 2015/0028416 A1* | 1/2015 | Zundel | .................. | H01L 29/404 |
| | | | | 257/331 |
| 2015/0155277 A1* | 6/2015 | Ogura | ................. | H01L 29/1095 |
| | | | | 257/140 |
| 2015/0162407 A1* | 6/2015 | Laven | ................. | H01L 29/7397 |
| | | | | 257/139 |
| 2015/0295042 A1* | 10/2015 | Kameyama | ......... | H01L 27/0629 |
| | | | | 257/140 |
| 2015/0318385 A1* | 11/2015 | Kameyama | ......... | H01L 29/7397 |
| | | | | 257/140 |
| 2015/0349091 A1* | 12/2015 | Yilmaz | ............... | H01L 29/4975 |
| | | | | 438/270 |
| 2016/0079235 A1* | 3/2016 | Matsudai | ............ | H01L 29/1095 |
| | | | | 257/140 |
| 2016/0336394 A1* | 11/2016 | Hu | ......................... | H01L 29/66 |
| 2018/0019331 A1* | 1/2018 | Sumitomo | ............ | H01L 23/485 |
| 2018/0323294 A1* | 11/2018 | Okuda | ................ | H01L 29/4238 |
| 2019/0006495 A1* | 1/2019 | Ogura | ................. | H01L 29/0619 |
| 2019/0115436 A1* | 4/2019 | Hossain | ............. | H01L 29/0696 |
| 2019/0259747 A1* | 8/2019 | Gejo | ................. | H01L 29/0623 |

FOREIGN PATENT DOCUMENTS

| | | |
|---|---|---|
| JP | 2017-147431 A | 8/2017 |
| WO | WO-2019205837 A1 * 10/2019 | ........... H01L 29/739 |

OTHER PUBLICATIONS

Machine translation, Huang, WIPO Pat. Pub. No. WO 2019-205837, translation date: Sep. 21, 2020, Espacenet, all pages. (Year: 2020).*

* cited by examiner

SEMICONDUCTOR DEVICE WITH MULTIPLE TRENCH STRUCTURES

BACKGROUND

Field

The present invention relates to a semiconductor device.

Background Art

Many of inverter devices used in various industrial fields such as domestic electrical appliances, electric vehicles, railways and the like drive an inductive load such as an induction motor. Such an inverter device can be formed by using a plurality of semiconductor devices including, for example, a switching device such as an Insulated Gate Bipolar Transistor (IGBT) or a Metal-Oxide-Semiconductor Field-Effect Transistor (MOSFET) and a reflux diode (hereinafter, sometimes referred to simply as a diode). The inverter devices are required to work highly efficiently and consume less electric power, and due to this, there are market demands for high-performance and low-cost semiconductor devices.

To enhance the performance of a power semiconductor device and reduce the production costs thereof, trench MOS gate structures, thin semiconductor substrates, and reverse conducting IGBTs (RC-IGBTs) have been developed. An RC-IGBT is a transistor in which an IGBT and a diode are integrally incorporated in a single semiconductor substrate.

JP 2017-147431 A discloses a semiconductor device having a trench gate structure. This semiconductor device includes a first conductive semiconductor substrate, a first conductive storage layer formed on a front surface side of the semiconductor substrate and having a higher impurity concentration than an impurity concentration of the semiconductor substrate, and a trench portion formed on a front surface of the semiconductor substrate. The trench portion includes a first conductive portion, a second conductive portion formed below the first conductive portion in a position lying lower than a center position of the storage layer in a depth direction thereof, and an insulating film that covers a side surface of the first conductive portion and a periphery of the second conductive portion, and the trench portion has at least either a split structure in which the insulating film isolates the first conductive portion from the second conductive portion or a thick film structure in which the insulating film is formed thicker on a side surface of the second conductive portion than a side surface of the first conductive portion.

In an IGBT region of an RC-IGBT, a trench gate, a gate electrode, a $p^+$ type diffusion layer, a p type base layer, an $n^+$ type emitter layer and an emitter electrode can be provided on a front surface side of a semiconductor substrate. Further, an n type buffer layer, a p type collector layer and a collector electrode can be provided on a rear surface side of the semiconductor substrate.

In a diode region of the RC-IGBT, a $p^-$ type anode layer having a low impurity concentration and an anode electrode can be provided on the front surface side of the semiconductor substrate. The anode electrode can also be used as the emitter electrode. Further, an n type buffer layer, an $n^+$ type cathode layer and a cathode electrode can be provided on the rear surface side of the semiconductor substrate. The cathode electrode can also be used as the collector electrode. In the IGBT region and the diode region, an $n^-$ type drift layer exists between the configuration on the front surface side and the configuration on the rear surface side.

In the RC-IGBT, the IGBT and the diode are disposed on the same substrate, and the IGBT and the diode, which lie adjacent to each other, affect each other. For example, when a positive bias voltage is applied to the gate electrode of the IGBT to operate the diode, an n type channel layer, which is an inversion layer, is formed in the p type base layer. This allows the $n^+$ type cathode layer, the n type buffer layer, the $n^-$ type drift layer, the n type channel layer and the $n^+$ type emitter layer to be connected electrically, to operate as a MOSFET. Then, when the diode operates, an electron carrier is not stored in the drift layer but flows into the IGBT region. This interrupts a normal bipolar operation, generating a snap back, whereby the output properties of the diode are deteriorated, or the ON voltage deteriorates.

In the structure proposed in JP 2017-147431 A, in the case where a positive bias is applied to the first conductive portion when the diode operates, an electron carrier is discharged by way of the channel of the IGBT, leading to fears that a normal bipolar operation is interrupted.

SUMMARY

The present invention has been made with a view to solving the problem described above, and an object of the present invention is to provide a semiconductor device in which a transistor region and a diode region are provided together on a single semiconductor substrate, the semiconductor device being configured to realize a good electrical characteristic when a diode operates.

In some examples, a semiconductor device includes an IGBT region extending from a front surface to a rear surface of a semiconductor substrate including a first conductive type drift layer, and a diode region extending from the front surface to the rear surface of the semiconductor substrate and lying adjacent to the IGBT region, wherein the IGBT region includes a second conductive type base layer formed on a side facing the front surface and a first trench portion provided to penetrate the base layer, wherein the first trench portion includes a first gate electrode of which a lower end lies above a lower end of the base layer, a second gate electrode provided directly below the first gate electrode, and an insulating film provided on a side surface of the first gate electrode, between the first gate electrode and the second gate electrode and on a side surface and a lower end portion of the second gate electrode, and wherein the diode region includes a second conductive type anode layer formed on a side facing the front surface and a second trench portion including a dummy gate electrode formed on the side facing the front surface.

Other and further objects, features and advantages of the invention will appear more fully from the following description.

DETAILED DESCRIPTION

Hereinafter, referring to drawings, embodiments will be described. The drawings are illustrated schematically, and therefore, correlations of constituent elements in size and position are variable. In the following description, like reference signs will be given to like or corresponding constituent elements, so that the repetition of similar descriptions may be omitted. In the following description, terms denoting specific positions and directions such as "up," "down," "side," "bottom," "front," "rear," and the like may be used; however, these terms are used as a matter of convenience to facilitate the understanding the contents of embodiments and hence do not limit the direction in which the present embodiment is carried out in reality. As to types of semiconductors, a first conductive type will be described as being an n type, while a second conductive type will be described as being a p type. However, the description may be reversed, so that the first conductive type may be described as being a p type, while the second conductive type may be described as being an n type. An $n^+$ type means that its donor impurity concentration is higher than a donor impurity concentration of an n type, while an $n^-$ type means that its donor impurity concentration is lower than the donor impurity concentration of the n type. Similarly, a $p^+$ type means that its acceptor impurity concentration is higher than an acceptor impurity concentration of a p type, while a $p^-$ type means that its acceptor impurity concentration is lower than the acceptor impurity concentration of the p type.

First Embodiment

Figure 1:
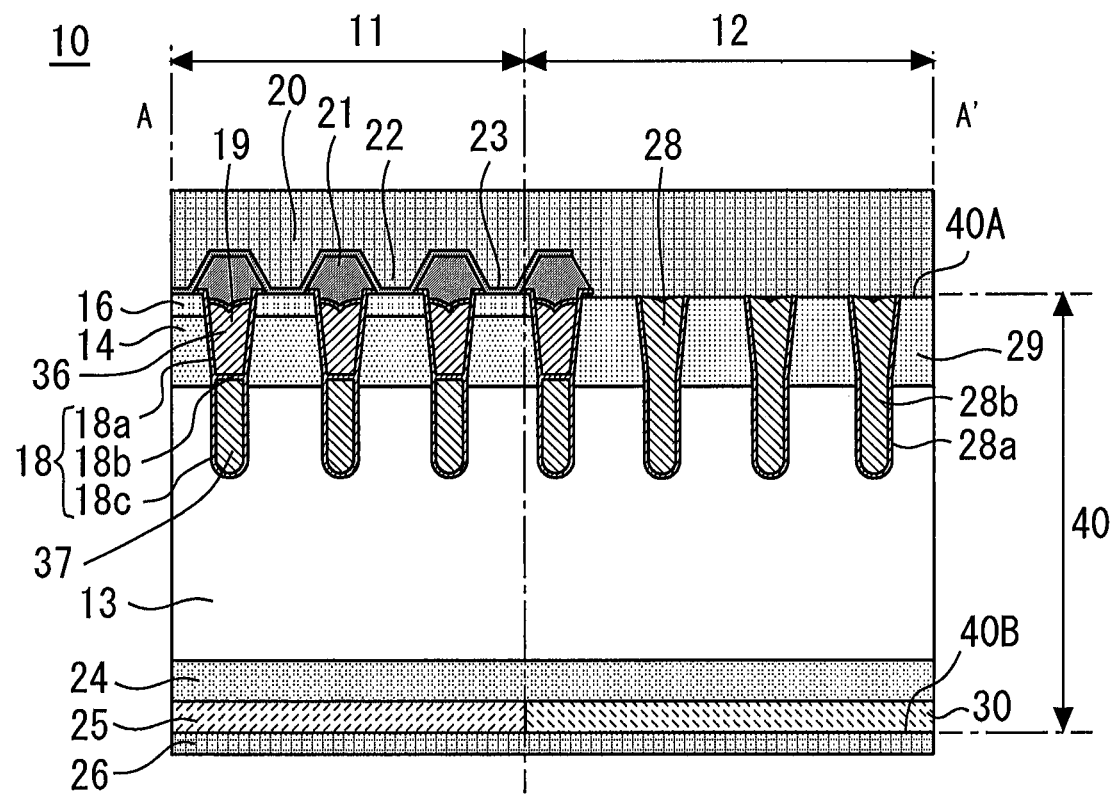
FIG. 1 is a cross-sectional view of a semiconductor device according to a first embodiment.

FIG. 1 is a cross-sectional view of a semiconductor device 10 according to a first embodiment. This semiconductor device 10 is an RC-IGBT. The semiconductor device 10 includes a semiconductor substrate 40. The semiconductor substrate 40 includes a front surface 40A, which is a first primary surface, and a rear surface 40B, which is a second primary surface positioned opposite to the first primary surface. The semiconductor substrate 40 includes a drift layer 13, which is of a first conductive type. One semiconductor substrate 40 includes an IGBT region 11 and a diode region 12. The IGBT region 11 extends from the front surface 40A to the rear surface 40B of the semiconductor substrate 40. The diode region 12 also extends from the front surface 40A to the rear surface 40B of the semiconductor substrate 40. The IGBT region 11 and the diode region 12 are adjacent to each other.

Figure 2:
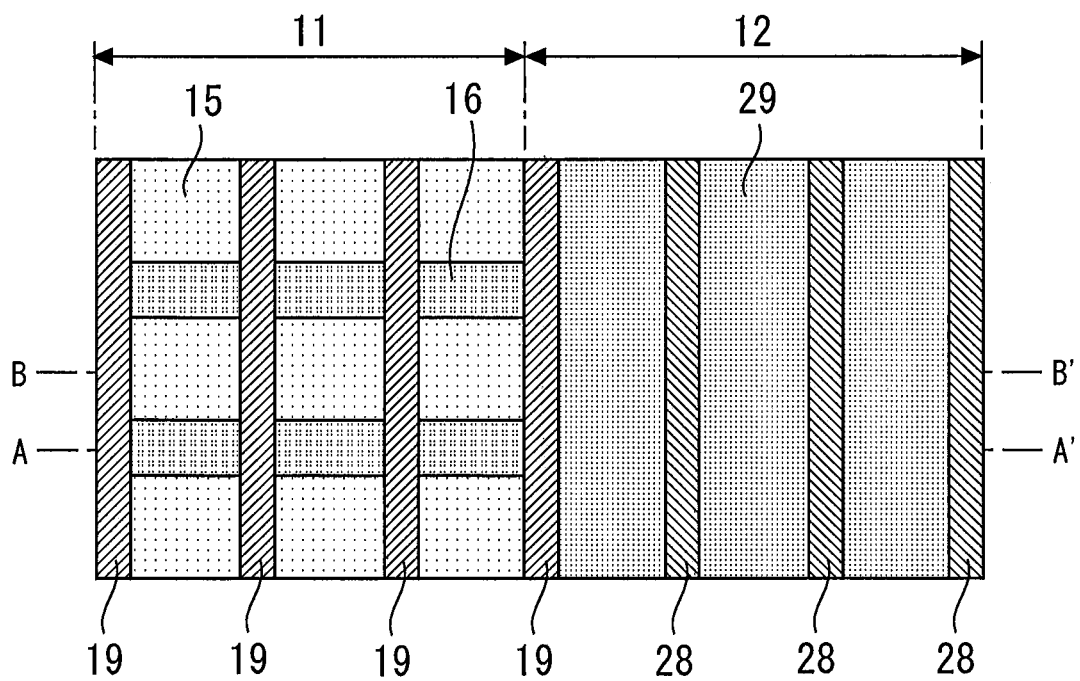
FIG. 2 is a plan view of the semiconductor device as viewed from the side of the front surface.

FIG. 2 is a plan view of the semiconductor device 10 as viewed from the side of the front surface 40A. The IGBT region 11 includes pluralities of $n^+$ type emitter layers 16, $p^+$ type diffusion layers 15 and first trench portions 19. The pluralities of emitter layers 16 and diffusion layers 15 are provided in an island shape. The plurality of first trench portions 19 are provided in a straight line. The diode region 12 includes pluralities of $p^-$ type anode layers 29 and second trench portions 28. The plurality of second trench portions 28 are provided in a straight line. FIG. 1 is the cross-sectional view taken along a line A-A' that passes through the emitter layers 16 in FIG. 2.

Figure 3:
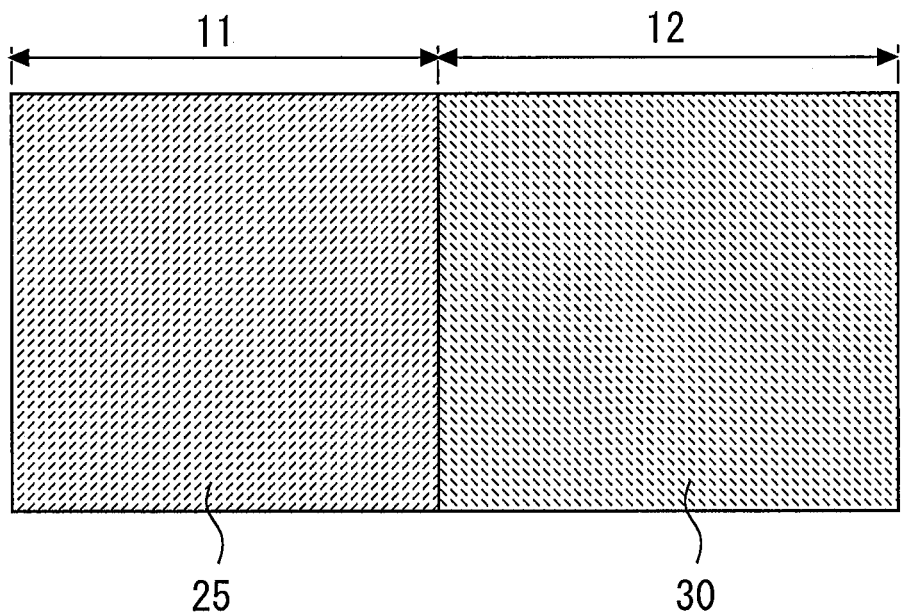
FIG. 3 is a plan view of the semiconductor device as viewed from the side of the rear surface.

FIG. 3 is a plan view of the semiconductor device 10 as viewed from the side of the rear surface 40B. An IGBT region 11 includes a p type collector layer 25. A diode region 12 includes an $n^+$ type cathode layer 30.

A configuration example of the IGBT region 11 will be described. As shown in FIG. 2, the IGBT region 11 includes the $p^+$ type diffusion layers 15 and the $n^+$ type emitter layers 16. Further, as illustrated in FIG. 1, the IGBT region 11 includes an $n^-$ type drift layer 13, a p type base layer 14, and the first trench portions 19. The base layer 14 is provided on an upper surface of the $n^-$ type drift layer 13. That is, the p type base layer 14 exists on the side of the front surface 40A. The $p^+$ type diffusion layers 15 or the $n^+$ type emitter layers 16 are formed selectively on an upper surface of the base layer 14. The $n^+$ type emitter layers 16 can be formed in such a manner as to surround the $p^+$ type diffusion layers 15 in a plan view.

The first trench portions 19 are provided in such a manner as to penetrate the base layer 14. The first trench portions 19 each include a first gate electrode 36, a second gate electrode 37 and an insulating film 18, as illustrated in FIG. 1. The first gate electrode 36 and the second gate electrode 37 are provided in such a manner as to be separated in an up-and-down direction in one trench groove. The first gate electrode 36 and the second gate electrode 37 can be formed from a conductive material such as polysilicon, for example. The first gate electrode 36 faces the base layer 14 via the insulating film 18. The insulating film 18 is formed from, a material such as $SiO_2$, for example. The second gate electrode 37 is provided directly below the first gate electrode 36. A lower end of the first gate electrode 36 lies above a lower end of the base layer 14. For example, an upper end portion of the second gate electrode 37 may face the base layer 14 via the insulating film 18.

The insulating film 18 can be provided on a side surface of the first gate electrode 36, between the first gate electrode 36 and the second gate electrode 37, and on a side surface and a lower end portion of the second gate electrode 37. The insulating film 18 includes a first portion 18a that is provided on the side surface of the first gate electrode 36, a second portion 18b that is provided between the first gate electrode 36 and the second gate electrode 37, and a third portion 18c that is brought into contact with the second gate electrode 37 and which covers a side surface and a lower end portion of the second gate electrode 37.

Figure 4:
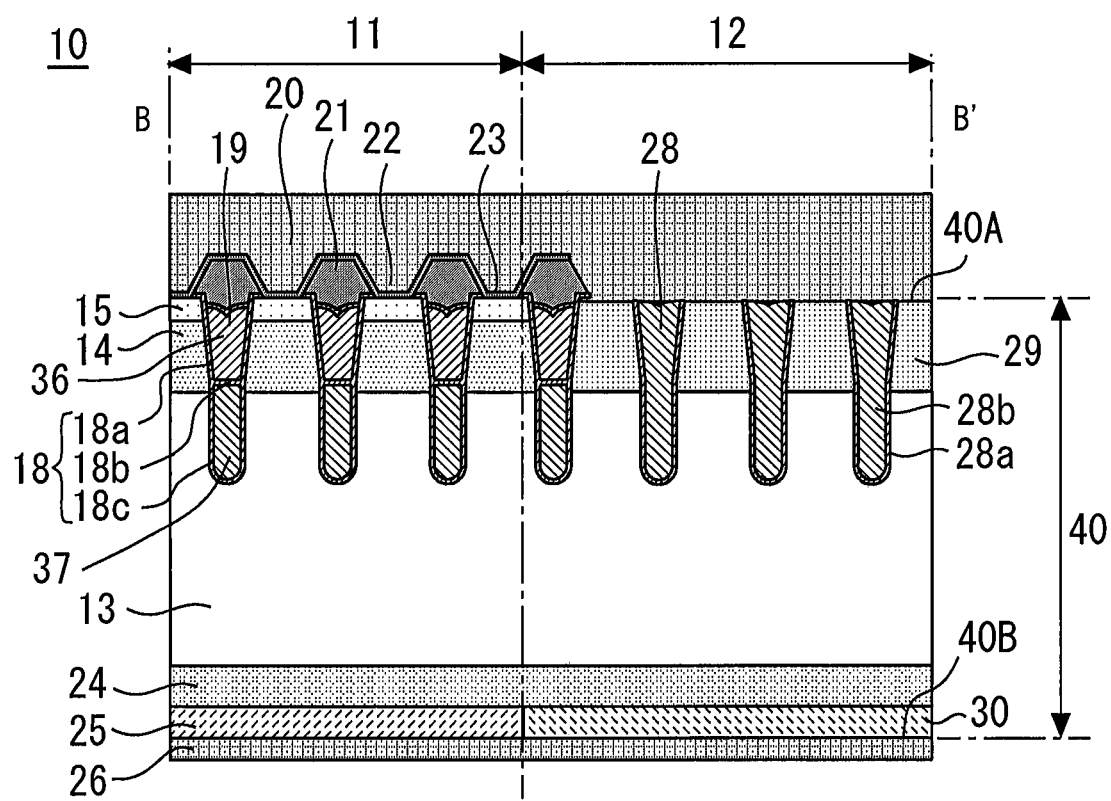
FIG. 4 is a cross-sectional view taken along a line B-B' in FIG. 2.

The first trench portion 19 penetrates the emitter layer 16 and the base layer 14 to reach the drift layer 13 as illustrated in FIG. 1 at a portion where the $n^+$ type emitter layer 16 is formed in a plan view, while the first trench portion 19 penetrates the diffusion layer 15 and the base layer 14 to reach the drift layer 13 at a portion where the $p^+$ type diffusion layer 15 is formed in a plan view. FIG. 4 is a cross-sectional view taken along a line B-B' that passes through the diffusion layers 15 in FIG. 2. FIG. 4 illustrates the first trench portions 19 penetrating the diffusion layers 15 and the base layer 14 to reach the drift layer 13.

As a front surface structure of the IGBT region 11, for example, as illustrated in FIG. 1, an emitter electrode 20, an interlayer dielectric 21, and a barrier metal 23 are formed.

The interlayer dielectric 21 covers the first trench portions 19, whereby the first gate electrodes 36 are insulated from the emitter electrode 20. Contact holes 22 are formed in the interlayer dielectric 21. The contact holes 22 allow $p^+$ type diffusion layers 15 and the $n^+$ type emitter layers 16 to be partially exposed from the interlayer dielectric 21. Then, the barrier metal 23 is formed on the interlayer dielectric 21 and interiors of the contact holes 22. The barrier metal 23 comes into contact with upper surfaces of the diffusion layers 15 and the emitter layers 16 in the contact holes 22. The barrier metal 23 comes into contact with the silicon semiconductor to become a silicide, whereby a contact resistance with the emitter layers 16 and the diffusion layers 15 is reduced.

A tungsten plug can be formed on the barrier metal 23 to realize fine design rules. With tungsten plugs used in the contact holes 22, the barrier metal 23 can be formed of a transition metal to obtain the advantageous effect described above. For example, the barrier metal 23 can be made into a multilayer structure including titanium or titanium nitride. The emitter electrode 20 is formed over the barrier metal 23 or the barrier metal 23 and the tungsten plugs. The emitter electrode 20 can be formed of, for example, aluminum or an aluminum alloy. The emitter electrode 20 comes into contact with the $n^+$ type emitter layers 16 via the barrier metal 23 and comes into contact with the $p^+$ type diffusion layers 15 via the barrier metal 23.

As a rear surface structure of the IGBT region 11, a n type buffer layer 24, a p type collector layer 25 and a collector electrode 26 can be formed. The buffer layer 24 is provided on a lower surface of the drift layer 13, and the collector layer 25 is provided on a lower surface of the buffer layer 24.

With the semiconductor device 10 described above that is the RC-IGBT having the IGBT region 11, a high channel density can be realized by a trench MOS gate structure having the p type base layer 14, the $p^+$ type diffusion layers 15, the insulating films 18 and the first gate electrodes 36. Further, the low loss can be realized by making the $n^-$ type drift layer 13 thin. With the $n^-$ type drift layer 13 made thin, a stopper for a depletion layer extending a pn junction of the p type base layer 14 and the $n^-$ type drift layer 13 becomes necessary when the IGBT is switched off. The n type buffer layer 24, having a high impurity concentration than that of the $n^-$ type drift layer 13, is provided as such a stopper. The provision of the buffer layer 24 is determined based on the application of the product concerned, and the buffer layer 24 may be omitted depending on the product's application.

A MOSFET of n channels is formed by the $n^-$ type drift layer 13, the p type base layer 14, the $n^+$ type emitter layers 16, the insulating films 18 and the first gate electrodes 36 when the IGBT is switched on, and an electric current flows along a path made up of the p type collector layer 25, the n type buffer layer 24, the $n^-$ type drift layer 13, the p type base layer 14 and the $p^+$ type diffusion layers 15. That is, the $n^-$ type drift layer 13, the p type base layer 14, the $n^+$ type emitter layers 16, the insulating films 18 and the first gate electrodes 36 are configured to have the trench MOS gate structure, thus, a plurality of such trench MOS gate structures being formed. The $p^+$ type diffusion layers 15 function to sweep out carriers generated when the IGBT is switched off and reduce the contact resistance with the emitter electrode 20. The IGBT region 11 is configured as has been described heretofore.

Next, a configuration example of the diode region 12 will be described. The semiconductor substrate 40 includes the $n^-$ type drift layer 13, a plurality of second trench portions 28 and a $p^-$ type anode layer 29 in the diode region 12. This drift layer 13 exists in both the IGBT region 11 and the diode region 12. The anode layer 29 is formed on the drift layer 13 in the diode region 12. That is, the $p^-$ type anode layer 29 exists on the side of the front surface 40A. The plurality of second trench portions 28 are formed from an upper surface of the anode layer 29 in such a manner as to penetrate the anode layer 29 to reach the drift layer 13. The second trench portion 28 includes a dummy gate insulating film 28a and a dummy gate electrode 28b that contacts the dummy gate insulating film 28a. The dummy gate electrode 28b can be formed from a conductive material such as polysilicon, for example. In this way, the second trench portions 28 are provided on the side of the front surface 40A.

The emitter electrode 20 is provided as a front surface structure of the diode region 12. The emitter electrode 20 constitutes an electrode that is used commonly by the IGBT region 11 and the diode region 12. The emitter electrode 20 is formed of aluminum or an aluminum alloy. By sharing the emitter electrode 20 by the IGBT region 11 and the diode region 12, the same condition for wire bonding or solder wettability can be used for the IGBT region 11 and the diode region 12 in an assembling process using the semiconductor device 10. A good diode characteristic can be obtained since the p type impurity concentration of the $p^-$ type anode layer 29 is low. When the $p^-$ type anode layer 29 is brought into contact with the barrier metal 23, however, a Schottky junction is produced, increasing the contact resistance. Consequently, according to an example, the barrier metal 23 is not provided on the diode region 12. In the case where the barrier metal 23 is brought into contact with the anode layer 29, the p type impurity concentration of the $p^-$ type anode layer 29 is increased, so that the barrier metal 23 and the anode layer 29 can be brought into contact with each other through an ohmic contact.

The n type buffer layer 24, an $n^+$ type cathode layer 30 and the collector electrode 26 are provided as a rear surface structure of the diode region 12. The n type buffer layer 24 and the collector electrode 26 can be used commonly by the IGBT region 11 and the diode region 12.

An operation of the diode region 12 when the diode is switched on will be described. When a positive voltage is applied between the emitter electrode 20 and the collector electrode 26, hole carriers are injected from the $p^-$ type anode layer 29 to the drift layer 13, and electron carriers are injected from the $n^+$ cathode layer 30 to the drift layer 13. Then, the diode is put in the ON state when the applied voltage becomes a drop voltage or greater. When the diode is put in the ON state, an electric current flows through a path made up of the emitter electrode 20, the $p^-$ type anode layer 29, the $n^-$ type drift layer 13, the $n^+$ cathode layer 30, and the collector electrode 26.

Next, an operation of the diode region 12 when the diode is switched off will be described. In general, the diode performs a recovery operation when it is switched from ON to OFF. The recovery operation means an operation in which the diode returns to the OFF state after an electric current temporarily flows to a negative voltage side of the diode, and this period is called a reverse recovery time. Further, a peak value of a negative current generated during the reverse recovery time is called a recovery current, and a loss generated then is called a recovery loss.

Consider a case where the insulating films 18 do not include the second portions 18b in the IGBT region 11, and one gate electrode is provided in one first trench portion (hereinafter, referred to as an integral gate electrode). In this case, when a positive bias voltage is applied to the integral gate electrode with the diode switched on, an n type channel layer is formed on the p type base layer 14, whereby the cathode layer 30, the buffer layer 24, the drift layer 13, the channel layer and the n⁺ type emitter layers 16 are electrically connected. This resembles a MOSFET operation of a unipolar device, and electron carriers supplied from the cathode layer 30 to the drift layer 13 flow to the IGBT region 11 by way of the channel layer. Then, when a large number of electron carriers flow to the IGBT region 11 without being stored in the drift layer 13, the diode is not normally switched on, generating a snap back.

Figure 5:
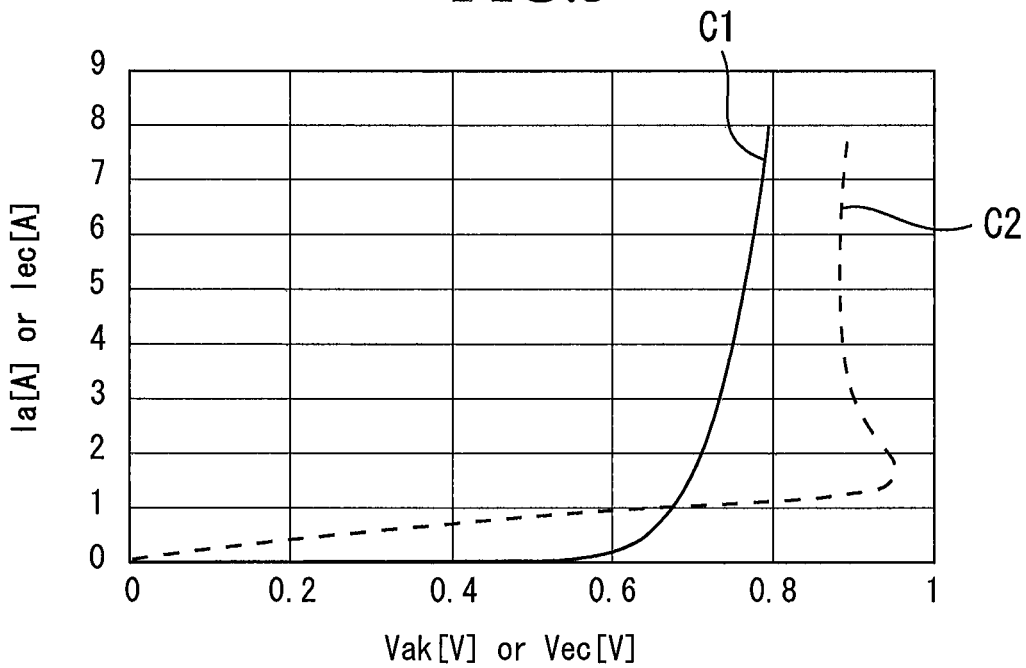
FIG. 5 is a chart showing the snap back.

FIG. 5 is a chart showing the snap back. An axis of abscissas denotes Vak (an anode-cathode voltage) or Vec (an emitter-collector voltage) and an axis of ordinates denotes Ia (an anode current) or Iec (an emitter-collector current). A waveform C2 indicated by a broken line shows the results of a simulation of a diode output waveform when a positive bias voltage is applied to the integral gate electrode with the diode switched on. The positive bias voltage means a voltage by which a gate-emitter voltage Vge becomes 15 V. A waveform C1 indicated by a solid line shows the results of a simulation of a diode output waveform when the positive bias voltage is not applied to the integral gate electrode with the diode switched on. It is seen from FIG. 5 that an electric current is caused to flow by a MOSFET operation at a low voltage by applying the positive bias voltage to the integral gate electrode.

In the semiconductor device 10 according to the first embodiment, the first trench portions 19 each include two separate upper- and lower-stage gate electrodes. Specifically, the first gate electrode 36 and the second gate electrode 37, which are separated, are provided in one first trench portion 19. The first gate electrode 36 and the second gate electrode 37 are electrically isolated from each other by the second portion 18b of the insulating film 18. That is, since the first gate electrode 36 and the second gate electrode 37 are electrically isolated, the first gate electrode 36 and the second gate electrode 37 can be given different voltages. For example, a gate drive voltage is input into the first gate electrode 36, while a gate potential, an emitter potential or a floating potential can be given to the second gate electrode 37.

The connection between the drift layer 13 and the channel layer can be cut off or a high resistance by applying a negative bias voltage to the second gate electrodes 37. Cutting off the connection between the drift layer 13 and the channel layer or producing the high resistance in the connection can prevent a snap back when the diode performs a forward operation or a shift in a direction in which a VF value is increased. When a ±15 V power supply is used in voltage application to the first gate electrodes 36 and the second gate electrodes 37, since a potential difference between the first gate electrode 36 and the second gate electrode 37 becomes 30 V in maximum, the insulating film 18 should be given a film thickness that can withstand the potential difference of 30 V. Assuming that the dielectric breakdown field strength of an insulating film formed from SiO₂ is 10×10⁶ V/cm, a film thickness of 0.03 μm or greater is necessary for 30 V. Due to this, with SiO₂ used for the material of the insulating film 18, the thickness of the second portion 18b should be 0.03 μm or greater, for example. In other words, the thickness of the insulating film can be 0.03 μm or greater between the first gate electrode 36 and the second gate electrode 37.

Figure 6:
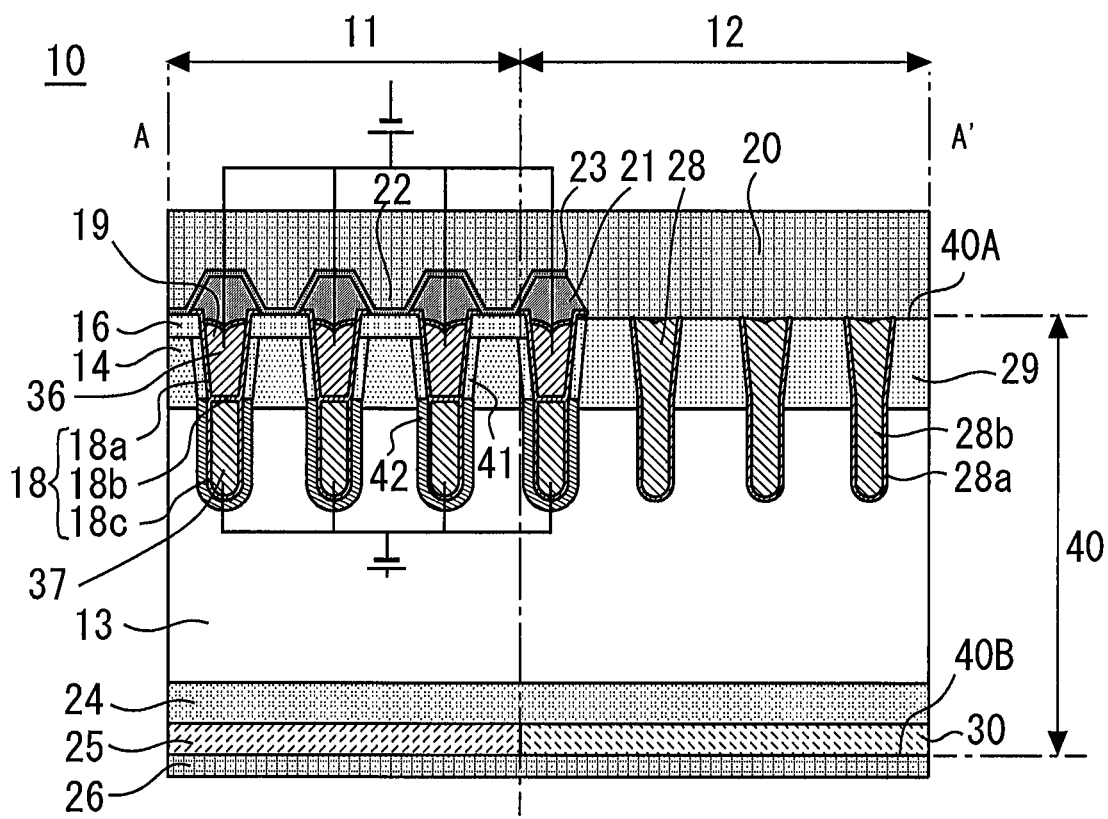
FIG. 6 is a cross-sectional view of the semiconductor device in a state where a voltage is applied.

FIG. 6 is a cross-sectional view of the semiconductor device illustrating a state where a positive voltage is applied to the first gate electrodes 36, while a negative voltage is applied to the second gate electrodes 37. In this case, an n type channel layer 41 is formed around the first gate electrode 36 via the first portion 18a of the insulating film 18, while a p type protection layer 42 is formed around the second gate electrode 37 via the third portion 18c of the insulating film 18. An electrical connection between the drift layer 13 and the channel layer 41 can be cut off or a high resistance by forming the p type protection layer 42. Providing a lower end of the first gate electrode 36 above a lower end of the base layer 14 facilitates the provision of the protection layer 42 between the drift layer 13 and the channel layer 41. For example, providing an upper end of the second gate electrode 37 above the lower end of the base layer 14 as required can ensure the provision of the protection layer 42 between the drift layer 13 and the channel layer 41.

Figure 7:
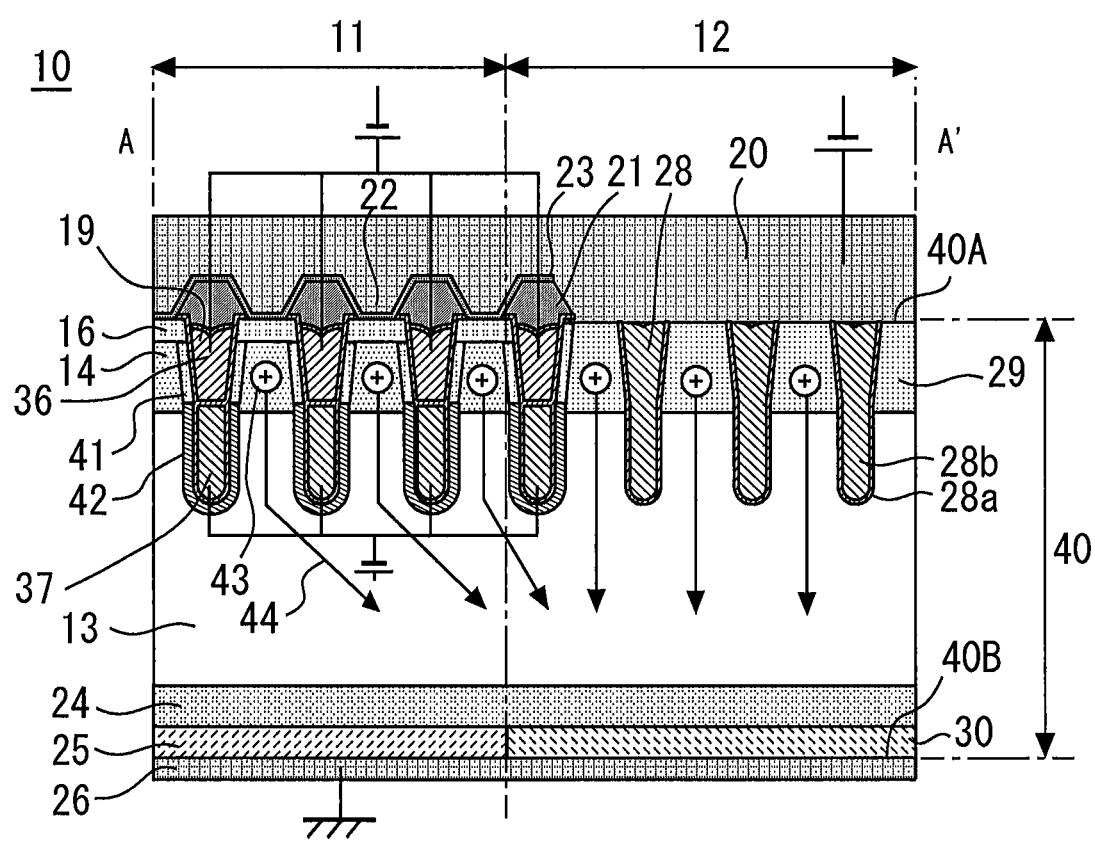
FIG. 7 is a cross-sectional view of the semiconductor device in a state where a voltage is applied.

FIG. 7 is a cross-sectional view of the semiconductor device illustrating an application of a positive bias voltage to the emitter electrode 20 while applying a positive voltage to the first gate electrodes 36 and a negative voltage to the second gate electrodes 37. FIG. 7 shows a case where the diode is switched on to operate. At this time, a pn diode between the p type base layer 14 and the n type drift layer 13 of the IGBT region 11 is switched on, and hole carriers 43 flow to the diode region 12 by way of paths 44.

For example, when a positive bias voltage is applied to the first gate electrodes 36 and a negative bias voltage is applied to the second gate electrodes 37, a normal bipolar operation represented by the waveform C1 in FIG. 5 is obtained. On the other hand, when a positive bias voltage is applied to the first gate electrodes 36, while no voltage is applied to the second gate electrodes 37, a MOS current flows in a low current region, whereby a snap back represented by the waveform C2 in FIG. 5 is generated. This difference is attributed to the existence of the p type protection layer 42. That is, an electrical connection between the channel layer 41 and the drift layer 13 can be cut off, or a high resistance by the protection layer 42.

Figure 8:
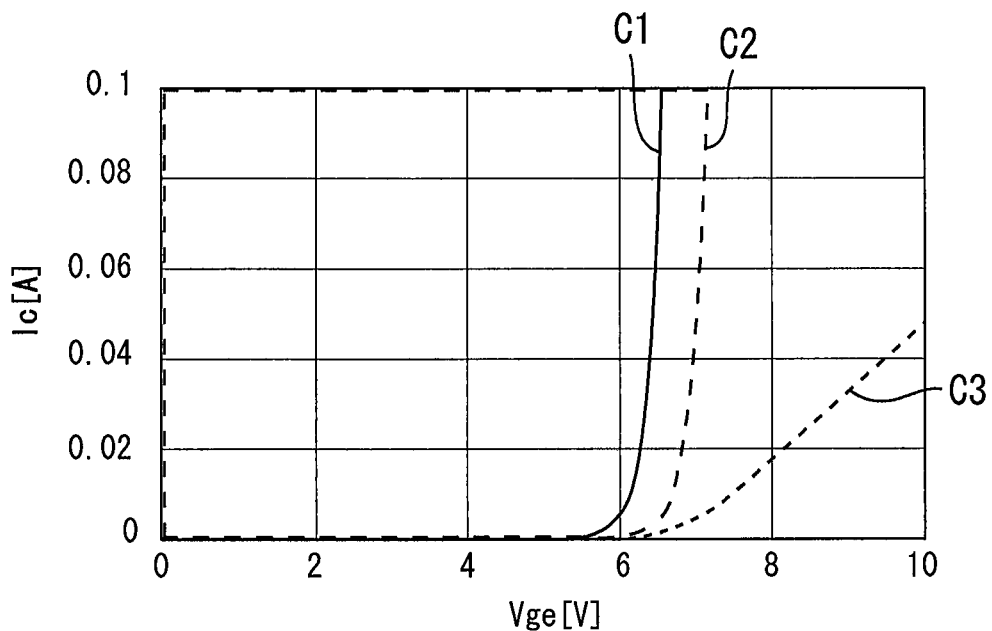
FIG. 8 shows the results of a simulation of a MOS characteristic of the diode.

FIG. 8 is a chart showing the results of a simulation of a MOS characteristic (Vge-Ic) of the diode of the semiconductor device 10 according to the first embodiment. Simulations were carried out on three devices that differ in a distance X from a lower end of a p type base layer 14 to a lower end of a first gate electrode 36. A curve C1 shows the results obtained from the simulation carried out on the semiconductor device of which X=0.1 μm, a curve C2 shows the results obtained from the simulation carried out on the semiconductor device of which X=0.2 μm, and a curve C3 shows the results obtained from the simulation carried out on the semiconductor device of which X=0.3 μm. The curves C1 and C2 show that a collector current Ic flows normally; however, the gradient of the curve C3 is small, showing that an operation failure occurs in the semiconductor device. Due to this, to enable the IGBT to operate normally, the distance X from the lower end of the p type base layer 14 to the lower end of the first gate electrode 36 is to be less than 0.3 μm, for example. In other words, the lower end of the first gate electrode 36 can be formed further upwards by less than 0.3 μm than the lower end of the base layer 14.

Thus, as has been described heretofore, according to the semiconductor device 10 of the first embodiment, even though the positive bias voltage is applied to the first gate electrodes 36 when the diode operates, the diode can perform a normal bipolar operation to obtain a good output characteristic of the diode.

Semiconductor devices according to other embodiments have many common features to those of the first embodiment, and therefore, different features will mainly be described below.

Second Embodiment

Figure 9:
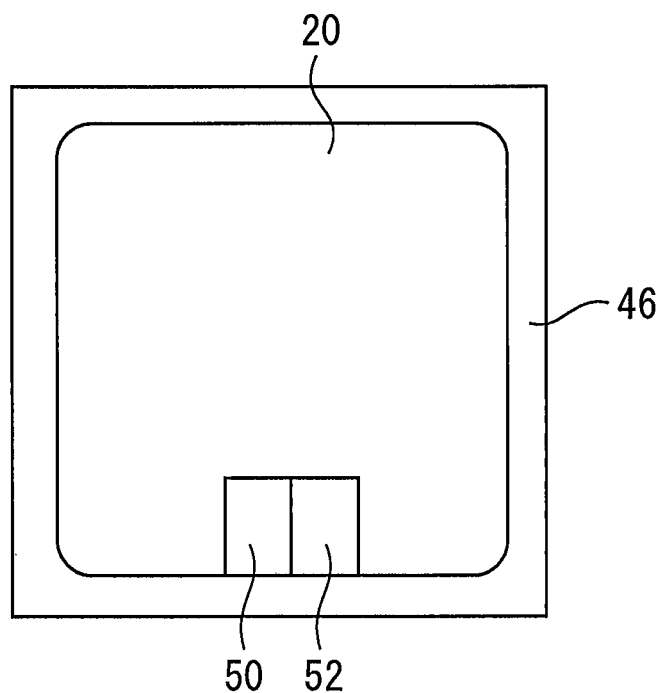
FIG. 9 is a cross-sectional view of a semiconductor device according to a second embodiment.

FIG. 9 is a plan view of a semiconductor device according to a second embodiment. This semiconductor device includes an emitter electrode 20, a first electrode pad 50 and a second electrode pad 52 that are electrically isolated. An annular terminal region 46 is provided along an outer edge of the semiconductor device.

Figure 10:
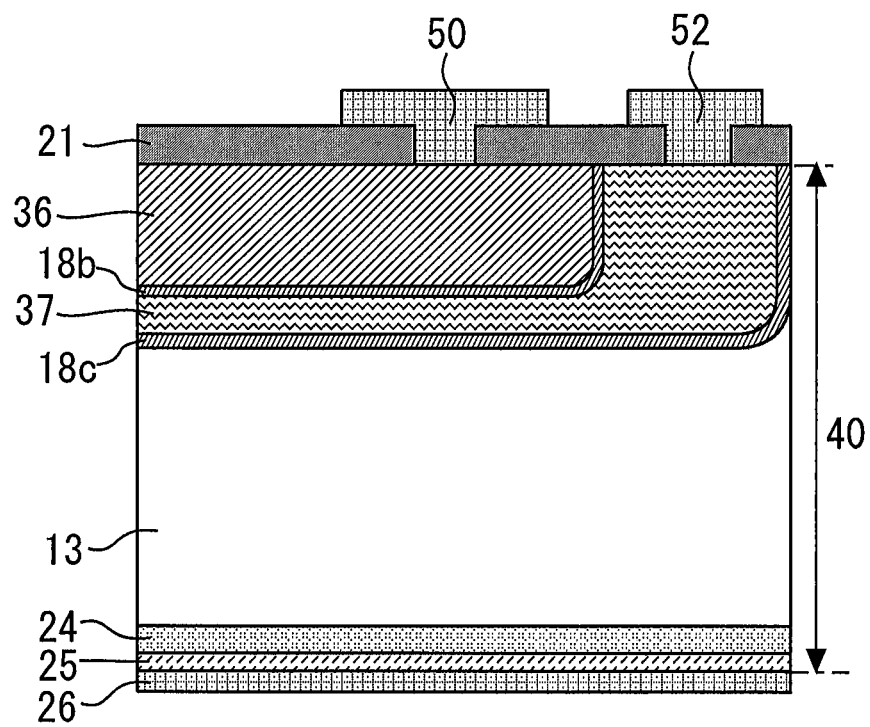
FIG. 10 is a partial cross-sectional view of the semiconductor device.

FIG. 10 is a cross-sectional view of the semiconductor device taken along a portion that includes the first electrode pad 50 and the second electrode pad 52 illustrated in FIG. 9. The first electrode pad 50 is electrically connected to a first gate electrode 36. The second electrode pad 52 is electrically connected to a second gate electrode 37. The first electrode pad 50 and the second electrode pad 52 are provided on a semiconductor substrate 40. These electrode pads are formed of an aluminum alloy, for example. FIG. 10 illustrates one example of a pattern of the first gate electrode 36 and the second gate electrode 37 that are electrically isolated. The separated first electrode pad 50 and second electrode pad 52 enable potentials of the first gate electrode 36 and the second gate electrode 37 to differ.

For example, applying a negative bias voltage to the second gate electrode 37 can cut off a connection between a drift layer 13 and a channel layer or produce a high resistance in the connection. The negative bias voltage is applied only when the connection between the drift layer 13 and the channel layer needs to be cut off or the high resistance needs to be produced in the connection, whereby the continuous negative bias voltage application can be avoided. For example, when an IGBT is switched on, no voltage is applied to the second gate electrode 37 while a gate drive voltage is applied to the first gate electrode 36 to form a channel layer.

Third Embodiment

Figure 11:
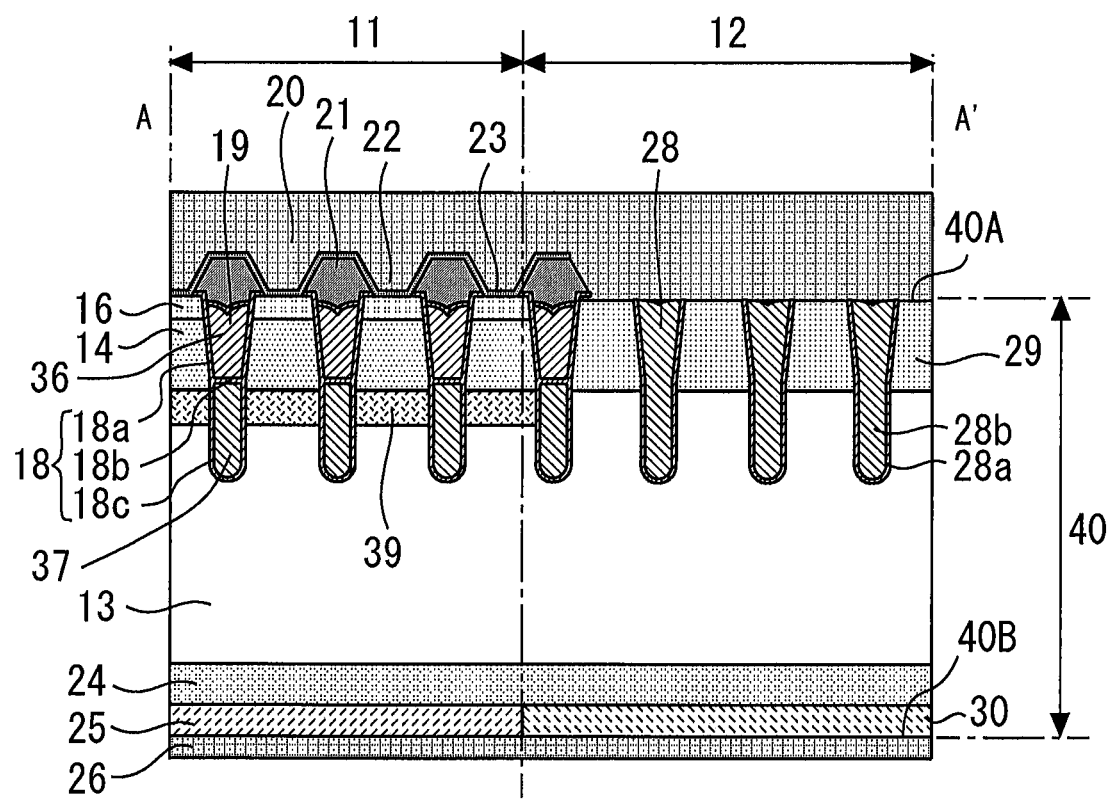
FIG. 11 is a cross-sectional view of a semiconductor device according to a third embodiment.

FIG. 11 is a cross-sectional view of a semiconductor device according to a third embodiment. A n type carrier storage layer 39 is provided underneath a base layer 14 in an IGBT region 11. A n type impurity concentration of the carrier storage layer 39 is higher than an n type impurity concentration of a drift layer 13. For example, the carrier storage layer 39 may be formed over the whole of the IGBT region 11. This reduces on resistances of the p type base layer 14 and the n⁻ type drift layer 13 when an IGBT is energized, whereby a steady-state loss can be reduced.

Fourth Embodiment

Figure 12:
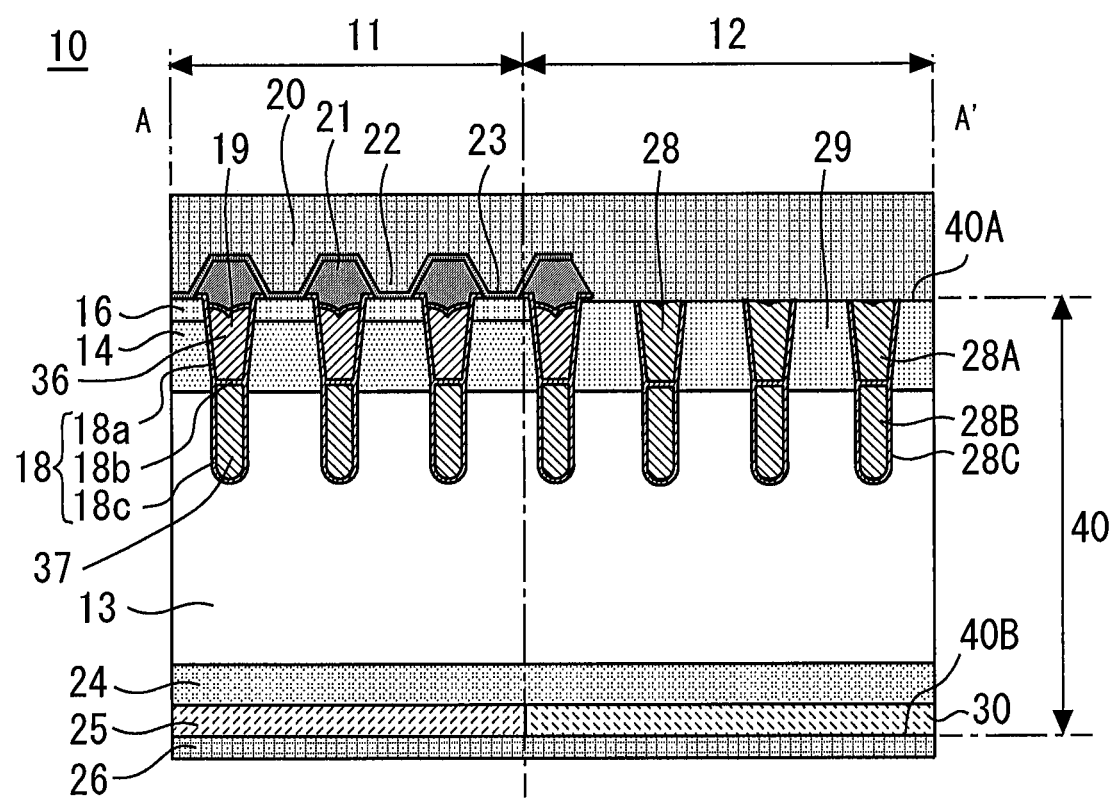
FIG. 12 is a cross-sectional view of a semiconductor device according to a fourth embodiment.

FIG. 12 is a cross-sectional view of a semiconductor device according to a fourth embodiment. Second trench portions 28 each include a first dummy gate electrode 28A and a second dummy gate electrode 28B provided directly below the first dummy gate electrode 28A. The second trench portions 28 each include a diode region insulating film 28C. The diode region insulating film 28C can be provided on a side surface of the first dummy gate electrode 28A, between the first dummy gate electrode 28A and the second dummy gate electrode 28B, and on a side surface and a lower end portion of the second dummy gate electrode 28B. In this way, the second trench portions 28 can be formed in the same shape and of the same material as first trench portions 19. This enables the trenches and interior electrodes of the IGBT and the diode to be formed in the same process, thereby making it possible to reduce the production costs.

According to the present embodiment, the first gate electrode and the second gate electrode, which is provided directly below the first gate electrode while being electrically isolated from the first electrode, are provided in the one trench portion in the transistor region, and a lower end of the first gate electrode is positioned above a lower end of the base layer. When a negative bias voltage is applied to the second gate electrode, a protection layer, which is a p type inversion layer, is formed on a drift layer, whereby an electron carrier can be prevented or restrained from flowing into the transistor region with a positive bias voltage applied to the first gate electrode when the diode is put in an ON state.

The invention claimed is:

1. A semiconductor device comprising:
   an IGBT region extending from a front surface to a rear surface of a semiconductor substrate including a first conductive type drift layer; and
   a diode region extending from the front surface to the rear surface of the semiconductor substrate and lying adjacent to the IGBT region, wherein
   the IGBT region comprises a second conductive type base layer formed on a side facing the front surface and a first trench portion provided to penetrate the base layer,
   the first trench portion comprises a first gate electrode of which a lower end lies above a lower end of the base layer, a second gate electrode provided directly below the first gate electrode, and an insulating film provided on a side surface of the first gate electrode, between the first gate electrode and the second gate electrode, and on a side surface and a lower end portion of the second gate electrode,
   the diode region comprises a second conductive type anode layer formed on a side facing the front surface and a second trench portion including a dummy gate electrode formed on the side facing the front surface, and
   wherein the lower end of the first gate electrode is formed further upwards by less than 0.3 μm than the lower end of the base layer.

2. The semiconductor device according to claim 1, comprising:
   a first electrode pad electrically connected to the first gate electrode and provided on the semiconductor substrate; and
   a second electrode pad electrically connected to the second gate electrode and provided on the semiconductor substrate.

3. The semiconductor device according to claim 1, wherein an upper end of the second gate electrode lies further upwards than the lower end of the base layer.

4. The semiconductor device according to claim 1, wherein the dummy gate electrode comprises a first dummy gate electrode and a second dummy gate electrode provided directly below the first dummy gate electrode, and
   wherein the second trench portion comprises a diode region insulating film provided on a side surface of the first dummy gate electrode, between the first dummy gate electrode and the second dummy gate electrode, and on a side surface and a lower end portion of the second dummy gate electrode.

5. The semiconductor device according to claim 1, comprising a first conductive type carrier storage layer provided underneath the base layer, the carrier storage layer having a higher impurity concentration than an impurity concentration of the semiconductor substrate.

6. The semiconductor device according to claim 1,
wherein a thickness of the insulating film is determined based on dielectric breakdown field strength of the insulating film in relation to a potential difference between the first gate electrode and the second gate electrode.

7. The semiconductor device according to claim 1,
wherein the second gate electrode faces the base layer via the insulating film.

8. A semiconductor device comprising:
an IGBT region extending from a front surface to a rear surface of a semiconductor substrate including a first conductive type drift layer; and
a diode region extending from the front surface to the rear surface of the semiconductor substrate and lying adjacent to the IGBT region, wherein
the IGBT region comprises a second conductive type base layer formed on a side facing the front surface and a first trench portion provided to penetrate the base layer, the first trench portion comprises a first gate electrode, a second gate electrode provided directly below the first gate electrode, and an insulating film provided on a side surface of the first gate electrode, between the first gate electrode and the second gate electrode, and on a side surface and a lower end portion of the second gate electrode,
an upper end of the second gate electrode lies further upwards than a lower end of the base layer, and
a lower end of the first gate electrode is formed further upwards by less than 0.3 μm than the lower end of the base layer.

9. The semiconductor device according to claim 8,
wherein the diode region comprises a second conductive type anode layer formed on a side facing the front surface and a second trench portion including a dummy gate electrode formed on the side facing the front surface.

* * * * *